United States Patent [19]

Roberts et al.

[11] Patent Number: 5,221,366
[45] Date of Patent: Jun. 22, 1993

[54] ETCHING AGENTS COMPRISING β-DIKETONE AND β-KETOIMINE LIGANDS AND A PROCESS FOR USING THE SAME

[75] Inventors: David A. Roberts, Carlsbad, Calif.; John C. Ivankovits, Northampton, Pa.; John A. T. Norman, Whitehall, Pa.; David A. Bohling, Emmaus, Pa.

[73] Assignee: Air Products and Chemicals, Inc., Allentown, Pa.

[21] Appl. No.: 677,918

[22] Filed: Apr. 1, 1991

Related U.S. Application Data

[63] Continuation-in-part of Ser. No. 502,209, Mar. 30, 1990, Pat. No. 5,009,725.

[51] Int. Cl.$^5$ .............................................. B23K 35/34
[52] U.S. Cl. ............................................ 148/22; 148/23; 156/903
[58] Field of Search .................................... 148/22–25

[56] References Cited

U.S. PATENT DOCUMENTS

| | | | |
|---|---|---|---|
| 2,801,194 | 7/1957 | Doerr | 148/23 |
| 2,801,195 | 7/1957 | Doerr | 148/23 |
| 2,801,196 | 6/1957 | Doerr | 148/23 |
| 3,301,688 | 1/1967 | Simpelaar | 106/1 |
| 3,985,586 | 10/1976 | Choby | 148/23 |
| 3,985,587 | 10/1976 | Choby | 148/23 |
| 4,059,218 | 11/1977 | Choby | 148/23 |
| 4,060,191 | 11/1977 | Choby | 148/23 |
| 4,216,035 | 8/1980 | Bakos | 148/23 |
| 5,116,432 | 5/1992 | Kerner | 148/24 |

OTHER PUBLICATIONS

Amendment under 37 C.F.R. 1.111 & Response to Restriction Requirement under 37 C.F.R. 1.143 re: 07/502,209.

First Office Action dated Jun. 22, 1990 re: 07/502,209.

*Primary Examiner*—Peter D. Rosenberg
*Attorney, Agent, or Firm*—Keith D. Gourley; James C. Simmons; William F. Marsh

[57] ABSTRACT

This invention is a residue-free vapor-phase process for etching metallic layers during the manufacturing of integrated circuits. The process comprises contacting a portion of the metallic surface to be etched with an effective amount of an etching agent comprising a β-diketone or β-ketoimine dispersed in an atmosphere capable of oxidizing the metal to be removed at a temperature sufficient to form a volatile metal-ligand complex. The volatile metal-ligand complex is sublimed from the surface thereby etching successive layers of the metal.

13 Claims, No Drawings

ETCHING AGENTS COMPRISING β-DIKETONE AND β-KETOIMINE LIGANDS AND A PROCESS FOR USING THE SAME

RELATED APPLICATIONS

This application is a continuation-in-part of application Ser. No. 07/502,209, filed on Mar. 30, 1990, now U.S. Pat. No. 5,009,725, the subject matter of the above-mentioned application which is specifically incorporated by reference herein.

TECHNICAL FIELD

The present invention relates to etching agents comprising an effective amount of a β-diketone or β-ketoimine ligand dispersed in an oxidizing atmosphere and a process for etching metallic films of the type used in manufacturing integrated circuits.

BACKGROUND OF THE INVENTION

Thin film integrated circuits are manufactured in a multi-step process wherein successive layers of conductive, semi-conductive and insulative materials are formed to create an integrated set of transistors. In order to create the appropriate structure for each of the materials in the device, various metallic patterns are deposited onto the substrate followed by selective etching to form the circuit. The term, etching, as used in the art of microelectronic fabrication, relates to a process wherein metallic material is removed from a substrate or from thin films deposited on the substrate's surface.

Traditional etching methods are carried out using "wet" techniques wherein a metallic surface to be etched is immersed in a liquid etching solution. Numerous problems are encountered when using liquid etching solutions including difficulty in controlling the etching rate, staining of the circuit board and disposing of hazardous liquid wastes.

The most advanced devices manufactured to date have tightly controlled geometric features of less than one micron. These small dimensions preclude the use of liquid etchants. Tremendous interest exists in developing "dry" etching methods in which the etchant is applied and removed in the vapor state. The use of such dry etching methods requires that the etch products have sufficient volatility to effect essentially complete removal from the surface to be etched.

Manufacturers are continually searching for etching agents and processes for using the same which eliminate the above-mentioned problems wherein high quality circuit assemblies can be fabricated without using reagents which are harmful to the environment.

BRIEF SUMMARY OF THE INVENTION

The present invention relates to etching agents of the type used in fabricating integrated circuits and printed circuit boards and a process for etching metallic films such as the type used in manufacturing integrated circuits. The process for etching a metallic film comprises contacting the metallic film with an etching agent comprising a β-diketone or β-ketoimine dispersed in an atmosphere capable of oxidizing the metallic film to be removed at a temperature sufficient to form a volatile metal-ligand complex. The volatile metal-ligand complex is easily removed from the surface of the metallic film by sublimation causing etching of the metallic film. The instant vapor-phase etching process overcomes numerous problems associated with wet etching solutions by eliminating the formation of metal-containing contaminants which can interfere with the subsequent deposition of conducting metals and other manufacturing operations.

Etching agents suitable for practicing the present invention comprise a β-diketone or β-ketoimine ligand represented by the formula:

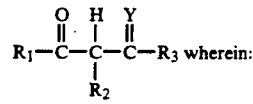

I $R_1$ and $R_3$ are independently selected from a linear or branched non-fluorinated, partially-fluorinated or fully fluorinated alkyl, akenyl or aryl group having from 1 to about 8 carbon atoms:

$R_2$ is a hydrogen atom, a fluorine atom or a linear or branched non-fluorinated, partially-fluorinated or fully fluorinated alkyl or akenyl group having from 1 to about 8 carbon atoms; and Y is selected from an oxygen atom; N-$R_4$ wherein $R_4$ is selected from a non-fluorinated, partially fluorinated, or fully fluorinated alkyl, aryl, aralkyl or hydroxyalkyl group having from 1 to about 10 carbon atoms, or Y is

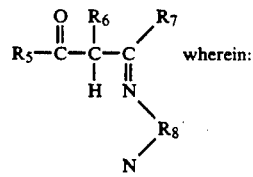

II $R_5 R_6$ and $R_7$ are independently selected from a hydrogen atom, a fluorine atom or a linear or branched non-fluorinated, partially fluorinated or fully fluorinated alkyl or alkenyl group having from 1 to about 8 carbon atoms; and $R_8$ is a linear or branched non-fluorinated, partially fluorinated or fully fluorinated alkylene, alkenylene, phenylene, alkylphenylene or hydroxy alkylene group having from 1 to about 8 carbon atoms;

wherein the ligand is dispersed in an atmosphere capable of oxidizing the surface of the metal to form a metal species which is capable or reacting with the ligand to form a volatile metal-ligand complex.

The above-mentioned Formula I represents three distinct types of ligands which are each suitable for practicing the etching process of the present invention. Each of the three ligand types is characterized by the definition of the Y group. When Y is an oxygen atom, the ligand is a β-diketone. When Y is N-$R_3$, the ligand is a β-ketoimine. Finally, when Y is represented by the structure according to Formula II, the ligand comprises two β-ketoimines bridges by an organic functionality.

The invention offers numerous advantages over conventional wet-etching methods because the instant etching process can be conducted in-situ, meaning that the substrate does not have to be exposed to the clean room environment during the transfer of the assembly to an apparatus suitable for conducting a wet etching operation, thereby avoiding recontamination via exposure to other contaminants. Moreover, the etching agents leave essentially no residue on the surface of the electronic assembly which might interfere with subsequent manufacturing steps.

DETAILED DESCRIPTION OF THE INVENTION

The present invention relates to etching agents used in fabricating electronics components and a vapor-phase process for etching metallic films such as the type used in manufacturing printed circuit boards. The invention offers numerous advantages over conventional wet-etching methods because the instant etching process can be conducted in-situ, meaning that the substrate can be etched with removing the same from the processing apparatus thereby avoiding needless exposure to the clean room environment. Recontamination via exposure to other contaminants is thereby avoided. Moreover, the etching agents leave essentially no residue on the metallic layer or substrate which might interfere with subsequent manufacturing steps.

The process for etching the metals described herein comprises contacting a portion of the metallic film to be etched with an etching agent comprising an effective amount of a $\beta$-diketone or $\beta$-ketoimine ligand dispersed in an atmosphere capable of oxidizing the metal at a temperature sufficient to form a volatile metal-ligand complex. The volatile metal-ligand complex is easily removed from the surface of the metallic film by sublimation thereby etching and removing successive layers of the metallic film. The process does not create metal-containing contaminant which can interfere with other operations conducted during the fabrication of printed circuit board assemblies.

The process according to the present invention can be conducted in a continuous process, wherein the metal to be etched is oxidized, in-situ, followed by the immediate formation of the volatile metal-ligand complex, or in a step-wise process. The step-wise process contemplates oxidizing the metal to be etched by contacting the same with an oxidizing atmosphere wherein the oxidized surface can be stored indefinitely until the desired time when the metal is to be etched. At the desired time, the metallic surface is subjected to an effective amount of the desired ligand wherein the ligand is dispersed in the enumerated oxidizing atmospheres or an inert gas such as argon, nitrogen, helium and the like. Each embodiment is contemplated by the present invention.

The metallic films which can be etched according to this invention include any metal capable of forming a metal oxide represented by the formulae including $MO$, $MO_2$, $MO_3$, $M_2O$ and $M_2O_3$ or a metal halide represented by the formula $N^{+n}X^{-n}$, wherein n is 1, 2 or 3 and X is a halogen selected from Cl, Br or I, when exposed to an oxidizing atmosphere under the enumerated operating temperatures. Suitable metals to be etched include gold, copper, iron, indium and tin. While the etching process according to the present invention is particularly suited toward etching metallic films which have been deposited onto substrates of the type used in the electronics industry, the process can also be used for etching patterns into bulk metallic objects.

A broad range of substrates are suitable for practicing the present invention and include any substrate capable of receiving a metal layer on its surface. Typical methods for depositing thin films on such substrates include chemical vapor deposition techniques. Representative substrates include, but are not limited to silicon silicon oxide, borophosphosilicate glass, phosphosilicate glass and strontium titanate.

Etching agents suitable for removing exposed portions of metallic films comprise a $\beta$-diketone or $\beta$-ketoimine represented by the formula:

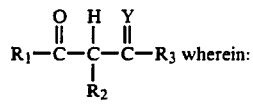

$R_1$ and $R_3$ are independently selected from a linear or branched non-fluorinated, partially-fluorinated or fully fluorinated alkyl, alkenyl or aryl group having from 1 to about 8 carbon atoms;

$R_2$ is a hydrogen atom, a fluorine atom or a linear or branched non-fluorinated, partially-fluorinated or fully fluorinated alkyl or alkenyl group having from 1 to about 8 carbon atoms; and Y is selected from an oxygen atom; $N-R_4$ wherein $R_4$ is selected from a non-fluorinated, partially fluorinated, or fully fluorinated alkyl, aryl, aralkyl or hydroxyalkyl group having from 1 to about 10 carbon atoms, or Y is

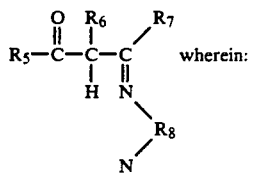

$R_5$, $R_6$ and $R_7$ are independently selected from a hydrogen atom, a fluorine atom or a linear or branched non-fluorinated, partially fluorinated or fully fluorinated alkyl or alkenyl group having from 1 to about 8 carbon atoms; and $R_8$ is a linear or branched non-fluorinated, partially fluorinated or fully fluorinated alkylene, alkenylene, phenylene, alkylphenylene or hydroxyalkylene group having from 1 to about 8 carbon atoms.

wherein the ligand is dispersed in an atmosphere capable of oxidizing the surface of the metal to form a metal species capable or reacting with the ligand to form a volatile metal-ligand complex.

Formula III represents three distinct types of ligands which are each suitable for practicing the etching process of the present invention. Each of the three types is characterized by the definition of the Y group. When Y is an oxygen atom, the ligand is a $\beta$-diketone. When Y is $N-R_3$, the ligand is a $\beta$-ketoimine. Finally, when Y is represented by the structure according to Formula IIIa, the ligand comprises two $\beta$-ketoimines bridged by an organic functionality. The volatility of the disclosed ligands is related to the extent of fluorination. Therefore, partially or fully fluorinated ligands are typically more volatile than non-fluorinated ligands.

The non-fluorinated, partially fluorinated and fully fluorinated $\beta$-diketone ligands suitable for use in the present process are represented by the formula:

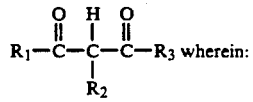

$R_1$ and $R_3$ are independently selected from a linear or branched non-fluorinated, partially-fluorinated or fully fluorinated alkyl, akenyl or aryl group having from 1 to about 8 carbon atoms; and $R_2$ is a hydrogen atom, a fluorine atom or a linear or branched non-fluorinated, partially-fluorinated or fully fluorinated alkyl or alkenyl group having from 1 to about 8 carbon atoms.

In a preferred embodiment according to Formula IV, $R_2$ is a hydrogen atom or a fluorine atom and $R_1$ and $R_3$ are independently selected from a fully fluorinated linear or branched alkyl group having front 1 to about 4 carbon atoms. Suitable alkyl groups to be fluorinated include methyl, ethyl, propyl, isopropyl, butyl, isobutyl, tert-butyl and the like.

The non-fluorinated, partially fluorinated and fully fluorinated β-ketoimine ligands of the present invention are represented by the formula:

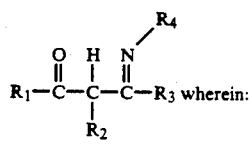

V $R_1$ and $R_3$ are independently selected from a linear or branched non-fluorinated, partially-fluorinated or fully fluorinated alkyl, alkenyl or aryl group having from 1 to about 8 carbon atoms;

$R_2$ is a hydrogen atom, a fluorine atom or a linear or branched non-fluorinated, partially-fluorinated or fully fluorinated alkyl or alkenyl group having from 1 to about 8 carbon atoms; and $R_4$ is selected from a non-fluorinated, partially fluorinated or fully fluorinated alkyl, aralkyl or hydroxy alkyl group having from 1 to about 10 carbon atoms.

A preferred method for preparing the β-ketoimine ligands disclosed in Formula V, particularly the partially or fully fluorinated β-ketoimine ligands, is disclosed in U.S. Pat. No. 4,950,790, the Specification which is specifically incorporated by reference herein. In a preferred embodiment, $R_1$ and $R_3$ are independently selected from fully fluorinated linear or branched alkyl group having from one to about four carbon atoms. Suitable alkyl groups to be fluorinated include methyl, ethyl, propyl, isopropyl, butyl, isobutyl and tert-butyl.

The β-ketoimines are prepared by treating the corresponding β-diketone with potassium hydride under conditions sufficient to produce the potassium salt of the diketone and subsequently reacting the resultant potassium salt of the diketone with a silylchloride such as tert-butyldimethylsilylchloride to produce a silylenolether having the general formula:

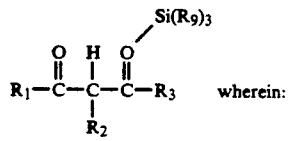

Va $R_9$ is a linear or branched alkyl group having front 1 to about 4 carbon atoms. The silylenolether described above is then treated with a primary monoamine, $R_3NH_2$, wherein $R_3$ is defined above, to produce the desired β-ketomine.

The non-fluorinated, partially fluorinated and fully fluorinated bridged β-ketoimine ligands of the present invention are represented by the formula:

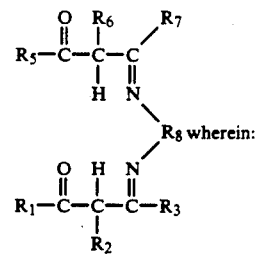

VI $R_1$ and $R_3$ are independently selected from a linear or branched non-fluorinated, partially-fluorinated or fully fluorinated alkyl, alkenyl or aryl group having from 1 to about 8 carbon atoms;

$R_2$ is a hydrogen atom, a fluorine atom or a linear or branched non-fluorinated, partially-fluorinated or fully fluorinated alkyl or alkenyl group having from 1 to about 8 carbon atoms;

$R_5 R_6$ and $R_7$ are independently selected from a hydrogen atom, a fluorine atom or a non-fluorinated, partially fluorinated or fully fluorinated alkyl or alkenyl group having from 1 to about 8 carbon atoms; and $R_8$ is a non-fluorinated, partially fluorinated or fully fluorinated linear or branched alkylene, alkenylene, phenylene, alkylphenylene or hydroxyalkylene group having from 1 to about 8 carbon atoms.

In a preferred embodiment, $R_1$ and $R_3$ are independently selected from a fully fluorinated linear or branched alkyl group having from one to about four carbon atoms and $R_2$ is a hydrogen atom or a fluorine atom. Suitable alkyl groups to be fluorinated include methyl, ethyl, propyl, isopropyl, butyl isobutyl and tert-butyl.

A preferred method for preparing the bridged β-ketoimine ligands according to Formula VI is described in U.S. Pat. No. 4,950,790, the Specification which is incorporated by reference herein. These ligands are prepared by treating the corresponding β-diketone with potassium hydride under conditions sufficient to form the potassium salt of the diketone and subsequently reacting the resultant tert-butyldimethylsilylchloride to produce a silylenolether represented by formula Va. The silylenolether is then treated with one equivalent of a primary diamine, $NH_2R_3NH_2$ wherein $R_3$ is defined above to produce the desired bridged β-ketoimine.

The ligands of the present invention can exist in two tautomeric forms, keto and enol, the structure of the enol form which is easily ascertained by those skilled in the art. Reference to the keto form of the above-mentioned ligands of this invention shall also expressly include the corresponding enol form.

As previously stated, the etching process is conducted in an atmosphere capable of oxidizing the metal to be etched. For the purpose of interpreting the Specification and appended claims, such oxidizing atmospheres include any atmosphere which can convert the subject metal to be etched to a corresponding metal oxide which is then capable of reacting with the subject ligands to form a volatile metal-ligand complex. Suitable atmospheres include, by way of examples, oxygen gas, steam, zero-grade air (a gaseous mixture containing about 19.5 to 23.5 mol percent oxygen and less than 0.5 mol percent hydrocarbons, with the remainder comprising nitrogen, sold by Air Products and Chemicals, Inc., Allentown, Penna.) HCl, HF, Cl$_2$, Br$_2$ and the like. Moreover, such oxidizing atmospheres may be dispersed in carrier gases such as argon, nitrogen, helium and perfluorinated hydrocarbons such as Multifluor ® APF-200 perfluoroisopropyldecalin, which is commercially available from Air Products and Chemicals, Inc., Allentown, Penna.

The etching agents according to the present invention can be applied by both machine and manual operations utilizing known methods including foam, wave dip, spray and brush etching operations. The foam, wave and dip etching operations are typically utilized with circuit boards having plated holes because these techniques provide capillary penetration of the etching agent into such holes.

The particular etching agent to be utilized and the appropriate oxidizing atmosphere or inert gas containing the oxidizing atmosphere for delivering the etching agents to the metallic films to be etched will depend upon numerous factors including the amount of metallic film to be etched, sensitivity of the electronic components to the etching agent, the desired time allotted for the etching process and the like.

In order to more fully describe the practice of the present process, a general embodiment of the instant etching process will be discussed. The metallic object or a substrate having a metallic film deposited thereon is placed into an infrared furnace, vapor phase machine or other suitable furnace typically used in etching or deposition processes known in the art and heated to about 200° to 300° C. The desired $\beta$-diketone or $\beta$-ketoimine and an oxidizing atmosphere (for example, electronic-grade oxygen gas) are passed into the hot zone of the furnace by conventional techniques.

The ligand-saturated oxidizing atmosphere is continuously or intermittently delivered into the furnace. The ligand reacts with metal oxidized and metal halides residing on the film and the species formed in-situ to form volatile metal-ligand complexes. The surface of the metallic film is continuously oxidized by reaction with the oxygen-containing atmosphere at elevated temperature to produce successive layers of metallic oxide which then react with the ligands disclosed herein. These volatile metal-ligand complexes are conveniently sublimed from the surface of the metallic film to produce an etched surface. The etching pattern can be conveniently controlled by masking operations known in the art wherein portions of the metallic surface which are not to be etched are covered with a material which does not react with the etching agent.

The $\beta$-diketone ligands of the present invention have been shown to react with commonly occurring oxides (CuO, Cu$_2$O, PbO, SnO and the like) typically residing on the metallic films deposited onto the substrates defined herein. The resultant reaction products have been analytically identified as Cu(HFac)$_2$, Pb(HFac)$_2$ and Sn(HFac)$_2$, respectively. Such products are sufficiently volatile such that following sublimation, essentially no residue remains on the substrate.

The desired etching agent should contain an effective amount of the desired; i.e., an amount such that maximum etching activity is obtained. The optimum concentration will vary depending upon the particular etching ligand used and the metal-containing compounds to be etched. Typical ligand concentrations range from 1.0% to about 40.0%, and preferably, from 5.0% to 25.0% of the desired ligand dispersed in the desired oxidizing atmosphere. If the ligand concentration in the oxidizing atmosphere is less than about 4.6%, decreased etching activity may occur.

The above-mentioned embodiment represents a significant advance in gas-phase etching processes. Prior to the present invention, gas-phase etching processes were believed to be unsuitable for use at typical reflow temperatures (190° to 230° C.) which are needed for the production of electronic printed circuit board assemblies. This gas-phase etching process offers numerous advantages over conventional processes in that the above-mentioned ligands easily saturate an oxidizing atmosphere and react exclusively with the metal oxides of interest without the aid of a catalyst to form reaction products which are sufficiently volatile to leave essentially no residue on the workpieces. Consequently, post-etching washes with solvents such as chloro-fluorocarbons which can recontaminate the substrate are not required to remove further residue.

The instant etching process can be practiced at temperatures comensurate with those used in conventional etching processes. Typical temperatures for practicing the process range from about 200° to 230° C. The optimum reaction time and temperature for practicing the process will vary depending upon the particular ligand used, the type and quantity of metal to be etched and the like. Typical processing time ranges from about 5 to 50 minutes. Shorter process times (i.e., <5 minutes) have been found to decrease etching effectiveness. Furnace pressure typically ranges from about 0 to 1.5 psig although the pressure is not critical to the practice of the invention.

The following example is provided to further illustrate an embodiment of the present invention and is not intended to restrict the scope of the invention. In the following example, temperatures are set forth uncorrected in degrees Celsius.

EXAMPLE

ETCHING OF A COPPER FILM WITH HEXAFLUOROACETYLACETONE

A thin film of copper (approximately 5000 angstoms) was deposited onto a glass slide by a conventional vapor deposition process. Approximately one-half of the substrate was masked with polyimide tape. The masked glass slide was placed at a 30 degree angle in a pyrex ® boat. Filtered zero grade air was bubbled through 1,1,1,5,5,5-hexafluoro-2,4-pentanedione, having the common name, hexafluoroacetylacetone, referred to herein as HFac (Strem Chemicals, Inc. Newburtport) at a rate of 20 sccm or 12.0% HFac in the process stream. The substrate was contacted with HFac and heated to 240° C. for 30 minutes. After about one minute, a faint green precipitate formed downstream along cooler sections of the reactor walls indicating the formation of volatile Cu(HFac). Upon completion, the unmasked portion of the metal film was etched down to the glass substrate with traces of metal remaining due to non-laminar flow pattern in the reactor. The metal film appeared to etch underneath the polyimide mask indicating isotropic etching.

Representative ligands suitable for use in the present invention are disclosed below wherein the chemical structure and both the IUPAC and abbreviated names of the ligands are provided.

4-(2,2,2-trifluoroethyl)-imino-1,1,1,5,5,5-hexafluoro-2-pentanone
(H)NONA-F[TFEA]

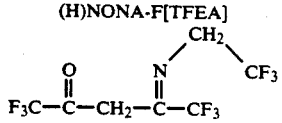

5-(2,2,2-trifluoroethyl)imino-1,1,1,2,2,6,6,6-octafluoro-3-hexanone
(H)UNDECA-F[TFEA]

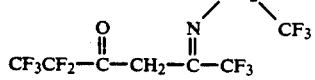

6-(2,2,2-trifluoroethyl)imino-1,1,1,2,2,3,3,7,7,7-decafluoro-4-heptanone
(H)TRIDECA-F[TFEA]

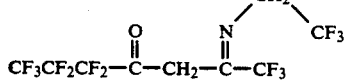

4-(phenyl)imino-1,1,1,5,5,5-hexafluoro-2-pentanone
(H)HEXA-F[AN]

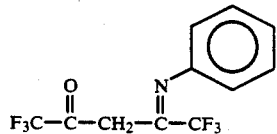

4-(2-hydroxyethyl)imino-1,1,1,5,5,5-hexafluoro-2-pentanone
(H)HEXA-F[EOA]

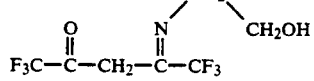

1,2-di[4-imino-1,1,1,5,5,5-hexafluoro-2-pentanone]ethane
(H$_2$)DODECA-F[EDA]

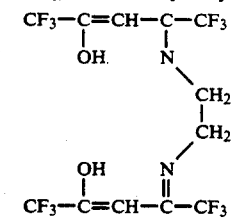

1,2-di-[5-imino-1,1,1,2,2,6,6,6-octafluoro-3-hexanone]ethane
(H$_2$)HEXADECA-F[EDA]

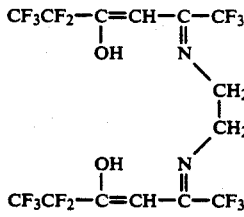

1,2-di[6-imino-1,1,1,2,2,3,3,7,7,7-decafluoro-4-heptanone]ethane
(H$_2$)EiCOSA-F[EDA]

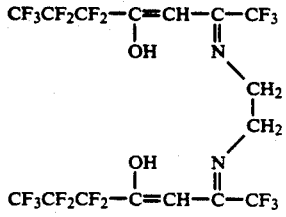

Bis[4(methylene)imino-1,1,1,5,5,5-hexafluoro-2-pentanone]methane

-continued
(H$_2$)DODECA-F[PDA]

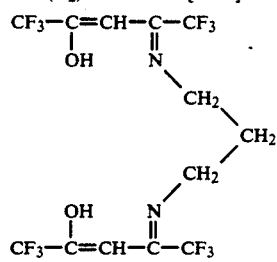

Bis[4-(methylene)imino-1,1,1,5,5,5-hexafluoro-2-pentanone]methanol
(H2)DODECA-F[PDA]

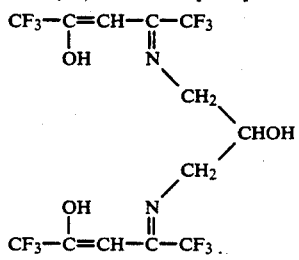

The present vapor-phase process for etching metallic substrates and metallic films deposited onto substrates such as the type used in the electronics industry offers numerous advantages over typical wet etching methods known in the art because the instant etching process can be conducted in the vapor-phase utilizing thereby eliminating the necessity for exposing the substrate to the clean room environment during apparatus transfer. Recontamination via exposure to other contaminants is thereby avoided. Moreover, the etching agents leave essentially no residue on the surface of the electronic assembly which might later interfere with subsequent manufacturing steps.

Having thus described the present invention, what is now deemed appropriate for Letters Patent is set out in the following appended claims.

We claim:

1. A vapor-phase process for etching a surface of a metal comprising contacting the surface of a metal with an effective amount of a ligand which is dispersed in an atmosphere capable of oxidizing the surface of the metal under conditions sufficient to form a volatile metal-ligand complex on the surface of the metal and subliming the metal-ligand complex to etch the surface of the metal, the ligand being represented by the formula:

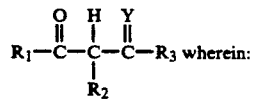 wherein:

$R_1$ and $R_3$ are independently selected from a linear or branched non-fluorinated, partially-fluorinated or fully fluorinated alkyl, alkenyl or aryl group having from 1 to about 8 carbon atoms;

$R_2$ is a hydrogen atom, a fluorine atom or a linear or branched non-fluorinated, partially-fluorinated or fully fluorinated alkyl or alkenyl group having from 1 to about 8 carbon atoms; and Y is selected from an oxygen atom; N-R$_4$ is selected from a non-fluorinated, partially fluorinated, or fully fluorinated alkyl, aryl, aralkyl or hydroxyalkyl group having from 1 to about 10 carbon atoms, or Y is

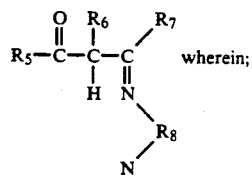 wherein;

R$_5$, R$_6$ and R$_7$ are independently selected from a hydrogen atom, a fluorine atom or a linear or branched non-fluorinated, partially-fluorinated or fully fluorinated alkyl or alkenyl group having from 1 to about 8 carbon atoms; and R$_8$ is a linear or branched non-fluorinated partially-fluorinated or fully fluorinated alkylene, alkenylene, phenylene, alkylphenylene or hydroxyalkylene group having from 1 to about 8 carbon atoms.

2. A vapor-phase process for etching a surface of a metal comprising contacting the surface of a metal with an effective amount of a ligand which is dispersed in an atmosphere capable of oxidizing the surface of the metal under conditions sufficient to form a volatile metal-ligand complex on the surface of the metal and subliming the metal-ligand complex to etch the surface of the metal, the ligand being represented by the formula:

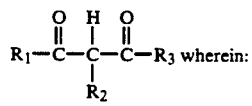 wherein:

R$_1$ and R$_3$ are independently selected from a linear or branched non-fluorinated, partially-fluorinated or fully fluorinated alkyl, alkenyl or aryl group having from 1 to about 8 carbon atoms; and R$_2$ is a hydrogen atom, a fluorine atom or a linear or branched non-fluorinated, partially-fluorinated or fully fluorinated alkyl or alkenyl group having from 1 to about 8 carbon atoms.

3. A vapor-phase process for etching a surface of a metal comprising contacting the surface of a metal with an effective amount of a ligand which is dispersed in an atmosphere capable of oxidizing the surface of the metal under conditions sufficient to form a volatile metal-ligand complex on the surface of the metal and subliming the metal-ligand complex to etch the surface of the metal, the ligand being represented by the formula:

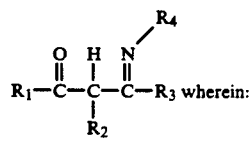 wherein:

R$_1$ and R$_3$ are independently selected from a linear or branched non-fluorinated, partially-fluorinated or fully fluorinated alkyl, alkenyl or aryl group having from 1 to about 8 carbon atoms;

R$_2$ is a hydrogen atom, a fluorine atom or a linear or branched non-fluorinated, partially-fluorinated or fully fluorinated alkyl or alkenyl group having from 1 to about 8 carbon atoms; and R$_4$ is selected from a non-fluorinated, partially fluorinated or fully fluorinated alkyl, aralkyl or hydroxyalkyl group having from 1 to about 10 carbon atoms.

4. A vapor-phase process for etching a surface of a metal comprising contacting the surface of a metal with an effective amount of a ligand which is dispersed in an atmosphere capable of oxidizing the surface of the metal under conditions sufficient to form a volatile metal-ligand complex on the surface of the metal and subliming the metal-ligand complex to etch the surface of the metal, the ligand being represented by the formula:

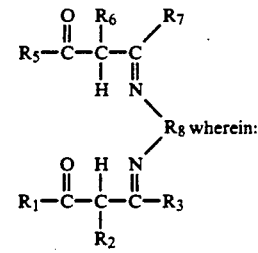 wherein:

R$_1$ and R$_3$ are independently selected from a linear or branched non-fluorinated, partially-fluorinated or fully fluorinated alkyl, alkenyl or aryl group having from 1 to 8 carbon atoms;

R$_2$ is a hydrogen atom, a fluorine atom or a linear or branched non-fluorinated, partially-fluorinated or fully fluorinated alkyl or alkenyl group having from 1 to about 8 carbon atoms;

R$_5$, R$_6$ and R$_7$ are independently selected from a hydrogen atom, a fluorine atom or a partially fluorinated or fully fluorinated alkyl or alkenyl group having from 1 to about 8 carbon atoms; and R$_8$ is a non-fluorinated, partially fluorinated or fully fluorinated linear or branched alkylene, alkenylene, phenylene, alkylphenylene or hydroxyalkylene group having from 1 to about 8 carbon atoms.

5. The etching process according to claim 1 wherein the metal to be etched is selected from gold, tin, copper, iron or indium.

6. The etching process according to claim 1 wherein the metal to be etched is copper.

7. The etching process according to claim 2 wherein the metal to be etched is selected from gold, tin, copper, iron or indium.

8. The etching process according to claim 2 wherein the ligand is selected from 1,1,1,5,5,5-hexafluoro-2,4-pentanedione, 1,1,1-trifluoro-2,4-pentanedione, 2,2,6,6-tetramethyl-3,5-heptanedione and 1,1,1,5,5,6,6,7,7,7-decafluoro-2,4-heptanedione.

9. The etching process according to claim 2 wherein the ligand is 1,1,1,5,5,5-hexafluoro-2,4-pentanedione and the metal to be etched is copper.

10. The etching process according to claim 3 wherein the metal to be etched is selected from gold, tin, copper, iron or indium.

11. The etching process according to claim 3 wherein the ligand is selected from 4-(2,2,2-trifluoroethyl)imino-1,1,1,5,5,5-hexafluoro-2-pentanone, 5-(2,2,2-trifluoroethyl)imino-1,1,1,2,2,6,6,6-octafluoro-3-hexanone, 6-(2,2,2-trifluoroethyl)imino-1,1,1,2,2,3,3,7,7,7,-decafluoro-4-heptanone and 4-(phenyl)imino-1,1,1,5,5,5-hexafluoro-2-pentanone.

12. The etching process according to claim 4 wherein the metal to be etched is selected from gold, tin, copper, iron or indium.

13. The etching process according to claim 4 wherein the ligand is selected from 1,2-di[4-imino-1,1,1,5,5,5-hexafluoro-2-pentanone]ethane, 1,2-di[5-imino-1,1,1,2,2,6,6,6-octafluoro-3-hexanone]ethane, 1,2,-di-[6-imino-1,1,1,2,2,3,3,7,7,7-decafluoro-4-heptanone]ethane and Bis[4-methylene)imino-1,1,1,5,5,5-hexafluoro-2-pentanone]methane.

* * * * *